United States Patent [19]

Morishita et al.

[11] Patent Number: 4,564,572

[45] Date of Patent: Jan. 14, 1986

[54] PROCESS FOR FORMING PATTERN

[75] Inventors: Hajime Morishita; Kiyoshi Miura, both of Tokyo; Osamu Sasaya; Saburo Nonogaki, both of Mobara, all of Japan

[73] Assignee: Hitachi, Ltd., Tokyo, Japan

[21] Appl. No.: 694,237

[22] Filed: Jan. 24, 1985

[30] Foreign Application Priority Data

Jan. 25, 1984 [JP] Japan ................................ 59-10066

[51] Int. Cl.[4] ............................................. B05D 3/06
[52] U.S. Cl. .................................... 430/28; 427/54.1; 427/68; 534/562
[58] Field of Search ...................... 427/43.1, 54.1, 68; 430/28, 26, 23; 534/558, 562

[56] References Cited

U.S. PATENT DOCUMENTS

| | | | |
|---|---|---|---|
| 3,775,131 | 11/1973 | Hendriks et al. | 534/562 |
| 4,269,918 | 5/1981 | Nonogaki et al. | 430/28 |
| 4,273,842 | 6/1981 | Nonogaki et al. | 430/28 |
| 4,391,885 | 7/1983 | Tomita et al. | 427/68 |
| 4,409,313 | 11/1983 | Morishita et al. | 430/28 |
| 4,425,419 | 1/1984 | Sasaya et al. | 430/28 |
| 4,436,804 | 3/1984 | Walls | 534/558 |
| 4,520,094 | 5/1985 | Morishita et al. | 430/28 |

FOREIGN PATENT DOCUMENTS

| | | | |
|---|---|---|---|
| 42704 | 12/1981 | European Pat. Off. | 430/28 |
| 126861 | 11/1978 | Japan | 430/28 |
| 15246 | 1/1984 | Japan | 430/28 |
| 2109948 | 6/1983 | United Kingdom | 430/28 |

*Primary Examiner*—John H. Newsome
*Attorney, Agent, or Firm*—Antonelli, Terry & Wands

[57] ABSTRACT

A process for forming a pattern on the interior side of a face plate of a color picture tube by using a photosensitive composition comprising p-diazo-N,N-dimethylaniline chloride-zinc chloride double salt and a p-diazobromophenol chloride-zinc chloride double salt and conducting imagewise exposure of coated film of the photosensitive composition to light and contacting with powder particles at least one time gives higher sensitivity compared with a conventional process.

11 Claims, No Drawings

PROCESS FOR FORMING PATTERN

BACKGROUND OF THE INVENTION

This invention relates to a process for forming a pattern.

The interior side of the face plate of a color picture tube is coated with three different kinds of phosphors in dots or in stripes. This phosphor coat layer is formed in the following way. First, a mixed coating material composed of a phosphor for the first color and a photosensitive resin is applied to the interior side of the face plate and dried to form a coating film. Then, this film layer is irradiated with ultraviolet rays through the holes of a shadow mask. The ultraviolet rays are irradiated to the position where the electron beams for effecting emission of light from the phosphor hit, that is, the place where said phosphor is to be attached. The photosensitive resin at the irradiated portions is insolubilized, resulting in insolubilization of the entire layer in the portions. Then the layer is washed with a solvent, retaining the insolubilized portions alone on the face plate while removing the other portions of the layer by dissolution. Then the same operation as said above is performed with the layer formed from a mixture of a phosphor for the second color and a photosensitive resin, and this is followed by the same operation by using a mixture of a phosphor for the third color and a photosensitive resin.

As appreciated from the foregoing explanation, the color picture tube phosphor surface forming process is complicated, and multiple times of repetition of wet coating, water washing and drying are required, so that simplification of such a process is quite desirable.

As an improvement on such process, some of the present inventors previously proposed, in Japanese Patent Application Kokai (Laid-Open) No. 126861/78, a method of forming a color picture tube phosphor surface in a considerably simpler manner than the prior art. This method was attained on the basis of a new finding that the photolytic product of an aromatic diazonium salt has an ability to accept powder particles, and it is characterized by (1) coating the inner surface of the face plate of a color picture tube with a photosensitive composition containing an aromatic diazonium salt as a photosensitive component and getting sticky upon exposure to light, thereby forming a thin coating layer on said surface, (2) subjecting said thin layer to patternwise exposure to make the exposed portions sticky, and (3) contacting powder particles with the exposed thin layer to have said powder particles accepted by said thin layer.

According to this method, mere repetition of exposure and powder contact is required for the phosphors of the second and third colors, and when the coating film is once formed, it is possible to form as many phosphor patterns as desired. This method, however, has a drawback in that the processing time is rather long due to a somewhat lower sensitivity of the photosensitive component than conventional photosensitive resins.

SUMMARY OF THE INVENTION

It is an object of this invention to provide a process for forming a pattern by using a highly sensitive composition.

This invention provides a process for forming a pattern which comprises (1) a step of coating a photosensitive composition comprising p-diazo-N,N-dimethylaniline chloride-zinc chloride double salt and a p-diazo-bromophenol chloride-zinc chloride double salt of the formula:

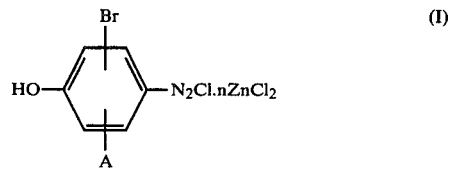

wherein A is hydrogen or bromine; and n is 1/2 to 1, on the interior side of a face plate of a color picture tube to form a coating film, (2) a step of imagewisely exposing the coating film to light to make the exposed portions sticky, (3) a step of contacting powder particles with the exposed coating film to adhere the powder particles to the exposed portions while preferably removing superfluous powder particles, and if necessary repeating the above-mentioned steps (2) and (3) at least one time.

DETAILED DESCRIPTION OF THE PREFERRED EMBODIMENTS

The pattern forming process of this invention is characterized by using a photosensitive composition comprising p-diazo-N,N-dimethylaniline chloride-zinc chloride double salt and a p-diazo-bromophenol chloride-zinc chloride double salt.

Aromatic diazonium salts heretofore used for pattern formation belong to p-diazo-aminobenzene chloride-zinc chloride double salts. Among these double salts, p-diazo-N,N-dimethylaniline chloride-zinc chloride double salt has particularly been used for the pattern forming process because of its excellent adaptability to the process. But when this material was used, the resulting light sticky film was low in sensitivity, which resulted in taking a long light exposure time. In order to improve the sensitivity, various photosensitizers have been studied. As a result, compounds represented by the formula:

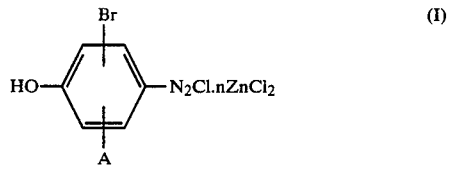

wherein A is hydrogen or bromine; and n is ½ to 1, showed good effects.

When this photosensitizer is used together with p-diazo-N,N-dimethylaniline chloride-zinc chloride double salt in an amount of 2 to 10% by weight, preferably 4 to 10% by weight, the same results can be obtained with shorter light exposure time of light sticky film than the case of adding no photosensitizer of the formula (I). When the amount exceeds 10% by weight, phosphor particles adhere to non-exposed portions to show the so-called "fogging" phenomenon.

Examples of the p-diazo-bromophenol chloride-zinc chloride double salt of the formula (I) are as follows:

p-diazo-2,6-dibromophenol chloride-zinc chloride double salt

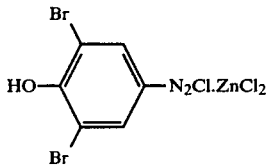

p-diazo-2-bromophenol chloride-zinc chloride double salt

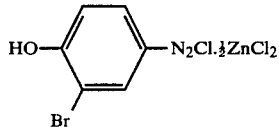

p-diazo-3,5-dibromophenol chloride-zinc chloride double salt

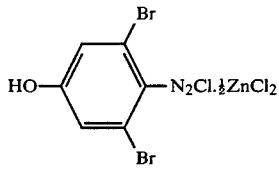

In order to improve coating properties of the photosensitive composition when formed into a thin film, the photosensitive composition may contain one or more organic polymeric compounds and/or surface active agents as disclosed in Japanese Patent Appln. Kokai (Laid-Open) No. 126861/78.

Examples of the organic polymeric compounds are gum arabic, poly(N-vinylpyrrolidone), poly(vinyl alcohol), polyacrylamide, hydroxypropylmethyl cellulose, alginic acid, propylene glycol ester of alginic acid, acrylamide-diacetoneacrylamide copolymer and methylvinyl ether-maleic anhydride copolymer. It is preferable to use the organic polymeric compounds in an amount of 0.5 to 50% by weight based on the total weight of the aromatic diazonium compounds.

Examples of the surface active agents are conventionally used cationic, anionic, nonionic surface active agents. The surface active agent is preferably used in an amount of 0.01 to 1% by weight based on the total weight of the aromatic diazonium compounds.

The photosensitive composition may further contain one or more aromatic diazonium salts other than those mentioned above.

In the present invention, a pattern is formed by applying a solution of said photosensitive composition to form a coating film, subjecting this coating film to exposure to light using a mask having a predetermined pattern to make the exposed portions sticky, then contacting the first powder with this coating film to attach the powder to the exposed portions, removing superfluous powder by a suitable means such as air spray (this removing step is particularly effective when repeating the above-mentioned steps), and if necessary repeating the above-mentioned steps after exposure at least one time, that is, for the second and third powders. In this way, a high-sensitivity pattern of several different kinds of powders can be formed.

The powders usable in this invention are those having a mean particle size of about 0.01 to 100 μm. In the case of using phosphors or pigment-coated phosphors, it is preferable to use powders having a mean particle size of about 4 to 15 μm.

The thus formed phosphor coating layer can be fixed by contacting it with an alkaline material vapor such as ammonia gas as disclosed in Japanese Patent Appln. Kokai (Laid-Open) No. 126861/78, etc.

This invention is illustrated by way of the following Synthesis Example and Examples, in which all percents are by weight unless otherwise specified.

SYNTHESIS EXAMPLE 1

Synthesis of p-diazo-2,6-dibromophenol chloride-zinc chloride double salt 2,6-Dibromo-4-nitrophenol was reduced with sodium borohydride using palladium-activated carbon as a catalyst at 40° C. An amine was taken out as hydrochloride, which was diazotized by a conventional method by dropping sodium nitride in an acidic state using hydrochloric acid. The desired double salt was obtained by pouring a 50% zinc chloride aqueous solution thereinto. The resulting double salt can be purified by recrystallization by pouring a concentrated aqueous solution of zinc chloride to a diluted hydrochloric acid aqueous solution containing the crude double salt for salting-out.

The resulting double salt had the following properties: infrared absorption spectrum (KBr tablet method) 3200, 2230 ($\nu N = N$), 1580, 1560, 1305, 1080, 850, 640, 520; maximum absorption wavelength in ultraviolet spectrophotometry 350 nm; molecular extinction coefficient $4.4 \times 10^4$; melting point 123 -124° C; zinc content (EDTA chelatometric titration) 13.6% (calculated value 14.0%).

Other double salts represented by the formula (I) were synthesized in the same manner as described above.

EXAMPLE 1

A photosensitive solution having the following composition was spin coated on a glass plate for test piece to give a crystallized film of 0.5 μm thick.

| Composition I | |
|---|---|
| p-Diazo-N,N—dimethylaniline chloride-zinc chloride double salt | 2.75% |
| p-Diazo-2,6-dibromophenol chloride-zinc chloride double salt | 0.14% |
| Propylene glycol ester of alginic acid | 0.275% |
| Water | balance |

The resulting film was exposed to ultraviolet rays from a 500 W super-high pressure mercury arc lamp via a shadow mask at a distance of 135 cm for 160 seconds. When a phosphor powder was contacted with the exposed portions, it adhered to the exposed positions very strongly.

For comparison, when a photosensitive composition containing no p-diazo-2,6-dibromophenol chloride-zinc chloride double salt was used, it required 250 seconds' irradiation in order to adhere the same amount of phosphor powder to the exposed portions.

EXAMPLE 2

The amount of p-diazo-2,6-dibromophenol chloride-zinc chloride double salt in the composition I was changed as shown in Table 1. The minimum exposure time for adhering the same amount of phosphor powder to the exposed portions was measured to examine a relationship between the added amount of the double salt and the sensitivity improving rate. The results are shown in Table 1.

TABLE 1

| Content of p-diazo-2,6-dibromophenol chloride-zinc chloride double salt (%) | Exposure time (sec) |
| --- | --- |
| 0 | 250 |
| 2 | 200 |
| 3 | 190 |
| 4 | 170 |
| 5 | 160 |
| 10 | 150 |

As mentioned above, the process for forming a pattern according to this invention gives higher sensitivity than conventional processes.

What is claimed is:

1. A process for forming a pattern which comprises
   (1) a step of coating a photosensitive composition comprising p-diazo-N,N-dimethylaniline chloride-zinc chloride double salt and a p-diazo-bromophenol chloride-zinc chloride double salt of the formula:

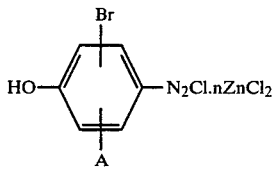

wherein A is hydrogen or bromine; and n is ½ to 1, on the interior side of a face plate of a color picture tube to form a coating film,
   (2) a step of imagewisely exposing the coating film to light to make the exposed portions sticky, and
   (3) a step of contacting powder particles with the exposed coating film to adhere the powder particles to the exposed portions.

2. A process according to claim 1, wherein the steps (2) and (3) are repeated at least one time.

3. A process according to claim 1, wherein the double salt of the formula (I) is contained in an amount of 2 to 10% by weight based on the weight of p-diazo-N,N-dimethylaniline chloride-zinc chloride double salt.

4. A process according to claim 1, wherein the double salt of the formula (I) is p-diazo-2,6-dibromophenol chloride-zinc chloride double salt.

5. A process according to claim 1, wherein the double salt of the formula (I) is p-diazo-2-bromophenol chloride-zinc chloride double salt.

6. A process according to claim 1, wherein the double salt of the formula (I) is p-diazo-3,5-dibromophenol chloride-zinc chloride double salt.

7. A photosensitive composition comprising p-diazo-N, N-dimethylaniline chloride-zinc chloride double salt and a p-azido-bromophenol chloride-zinc chloride double salt of the formula:

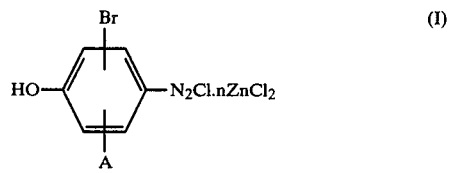

wherein A is hydrogen or bromine; and n is ½ to 1.

8. A composition according to claim 7, wherein the double salt of the formula (I) is contained in an amount of 2 to 10% by weight based on the weight of p-diazo-N, N-dimethylaniline chloride-zinc chloride double salt.

9. A composition according to claim 7, wherein the double salt of the formula (I) is p-diazo-2,6-dibromophenol chloride-zinc chloride double salt.

10. A composition according to claim 7, wherein the double salt of the formula (I) is p-diazo-2-bromophenol chloride-zinc chloride double salt.

11. A composition according to claim 7, wherein the double salt of the formula (I) is p-diazo-3,5-dibromophenol chloride-zinc chloride double salt.

* * * * *